(12) United States Patent
Cui et al.

(10) Patent No.: US 10,299,413 B2
(45) Date of Patent: May 21, 2019

(54) MODULAR SELF-ALIGNING LIQUID HEAT REMOVAL COUPLING SYSTEM FOR ELECTRONIC RACKS

(71) Applicant: Baidu USA LLC, Sunnyvale, CA (US)

(72) Inventors: Yan Cui, San Jose, CA (US); Tianyi Gao, Santa Clara, CA (US); Ali Heydari, Albany, CA (US); Charles J. Ingalz, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 15/438,600

(22) Filed: Feb. 21, 2017

(65) Prior Publication Data
US 2018/0242478 A1    Aug. 23, 2018

(51) Int. Cl.
*H05K 7/20* (2006.01)
*H01R 3/08* (2006.01)
*H05K 7/14* (2006.01)

(52) U.S. Cl.
CPC ........... *H05K 7/20772* (2013.01); *H01R 3/08* (2013.01); *H05K 7/1487* (2013.01); *H05K 7/1489* (2013.01); *H05K 7/20781* (2013.01)

(58) Field of Classification Search
CPC .......... F16L 37/12; F16L 37/084; F16L 37/50
See application file for complete search history.

(56) References Cited

U.S. PATENT DOCUMENTS

| | | | | |
|---|---|---|---|---|
| 5,325,263 A | * | 6/1994 | Singer | G06F 1/184 361/679.39 |
| 5,652,695 A | * | 7/1997 | Schmitt | G11B 33/126 361/679.31 |
| 5,761,045 A | * | 6/1998 | Olson | G06F 1/189 312/223.2 |
| 5,782,508 A | * | 7/1998 | Bartholomew | F16L 37/0987 285/308 |
| 6,319,053 B1 | * | 11/2001 | Andrews | H01M 2/1022 320/112 |

(Continued)

FOREIGN PATENT DOCUMENTS

WO   WO 2016053323 A1 *  4/2016  ........... H05K 7/1487

OTHER PUBLICATIONS

Aeroquip Blind Mate Quick Connectors (Year: 2013).*

*Primary Examiner* — David M Sinclair
*Assistant Examiner* — Robert D Brown
(74) *Attorney, Agent, or Firm* — Womble Bond Dickinson (US) LLP

(57) ABSTRACT

An electronic rack includes a back panel, a number of server slots, and a number of server blades inserted therein. The back panel includes a heat removal liquid manifold to provide heat removal liquid from an external heat removal system to remove heat from the server blades. Each server blade includes a server tray to contain an information technology (IT) component and a self-fitting coupling assembly having a first liquid intake connector and a first liquid outlet connector to self-align with a second liquid intake connector and a second liquid outlet connector mounted on the liquid manifold mounted on the back panel. The first liquid intake connector and the first liquid outlet connector are capable of moving around within a predetermined tolerance space with respect to the server tray.

23 Claims, 13 Drawing Sheets

(56) References Cited

U.S. PATENT DOCUMENTS

| | | | |
|---|---|---|---|
| 6,322,382 B1* | 11/2001 | Viallet | H01R 13/6315 439/248 |
| 6,483,710 B1* | 11/2002 | Reasoner | H05K 7/1411 29/830 |
| 7,267,568 B2* | 9/2007 | Baker | H01R 13/6315 439/247 |
| 7,854,652 B2* | 12/2010 | Yates | E04H 5/02 361/690 |
| 7,911,778 B2* | 3/2011 | Merrow | G11B 19/042 312/223.1 |
| 7,963,119 B2* | 6/2011 | Campbell | G06F 1/20 165/104.33 |
| 9,013,873 B2* | 4/2015 | Wei | H05K 7/20781 165/104.33 |
| 9,016,352 B2* | 4/2015 | Helbig | F28F 9/007 165/67 |
| 9,297,571 B1* | 3/2016 | Correa | F25D 19/00 |
| 9,901,013 B2* | 2/2018 | Shedd | H05K 7/20809 |
| 2009/0161312 A1* | 6/2009 | Spearing | H05K 7/20727 361/679.47 |
| 2009/0198388 A1* | 8/2009 | Hillis | H05K 7/1497 700/300 |
| 2009/0225514 A1* | 9/2009 | Correa | H05K 7/20781 361/701 |
| 2010/0110626 A1* | 5/2010 | Schmitt | H05K 7/1497 361/679.47 |
| 2011/0175498 A1* | 7/2011 | Bash | F24F 11/0001 312/107 |
| 2013/0312846 A1* | 11/2013 | Eriksen | F16L 37/34 137/315.01 |
| 2014/0190198 A1* | 7/2014 | Slessman | H05K 7/20745 62/314 |
| 2015/0160702 A1* | 6/2015 | Franz | G06F 1/20 361/679.47 |
| 2016/0010772 A1* | 1/2016 | Tiberghien | B23P 15/26 165/177 |
| 2016/0113149 A1* | 4/2016 | Krug, Jr. | H05K 7/20781 361/679.53 |
| 2016/0120071 A1* | 4/2016 | Shedd | H05K 7/20772 361/679.47 |
| 2017/0127575 A1* | 5/2017 | Lunsman | F16L 37/12 |
| 2017/0127576 A1* | 5/2017 | Campbell | H05K 7/20781 |
| 2017/0177041 A1* | 6/2017 | Shelnutt | G06F 1/20 |
| 2017/0181324 A1* | 6/2017 | Shelnutt | H05K 7/20781 |
| 2017/0181326 A1* | 6/2017 | Shelnutt | G05D 7/0629 |
| 2017/0181327 A1* | 6/2017 | Shelnutt | H05K 7/20836 |
| 2017/0181328 A1* | 6/2017 | Shelnutt | H05K 7/20836 |
| 2017/0181329 A1* | 6/2017 | Shelnutt | H05K 7/20836 |
| 2017/0303439 A1* | 10/2017 | Cader | H05K 7/20736 |
| 2017/0303441 A1* | 10/2017 | Farshchian | H05K 7/20327 |
| 2018/0027698 A1* | 1/2018 | Cader | H05K 7/20272 |

\* cited by examiner

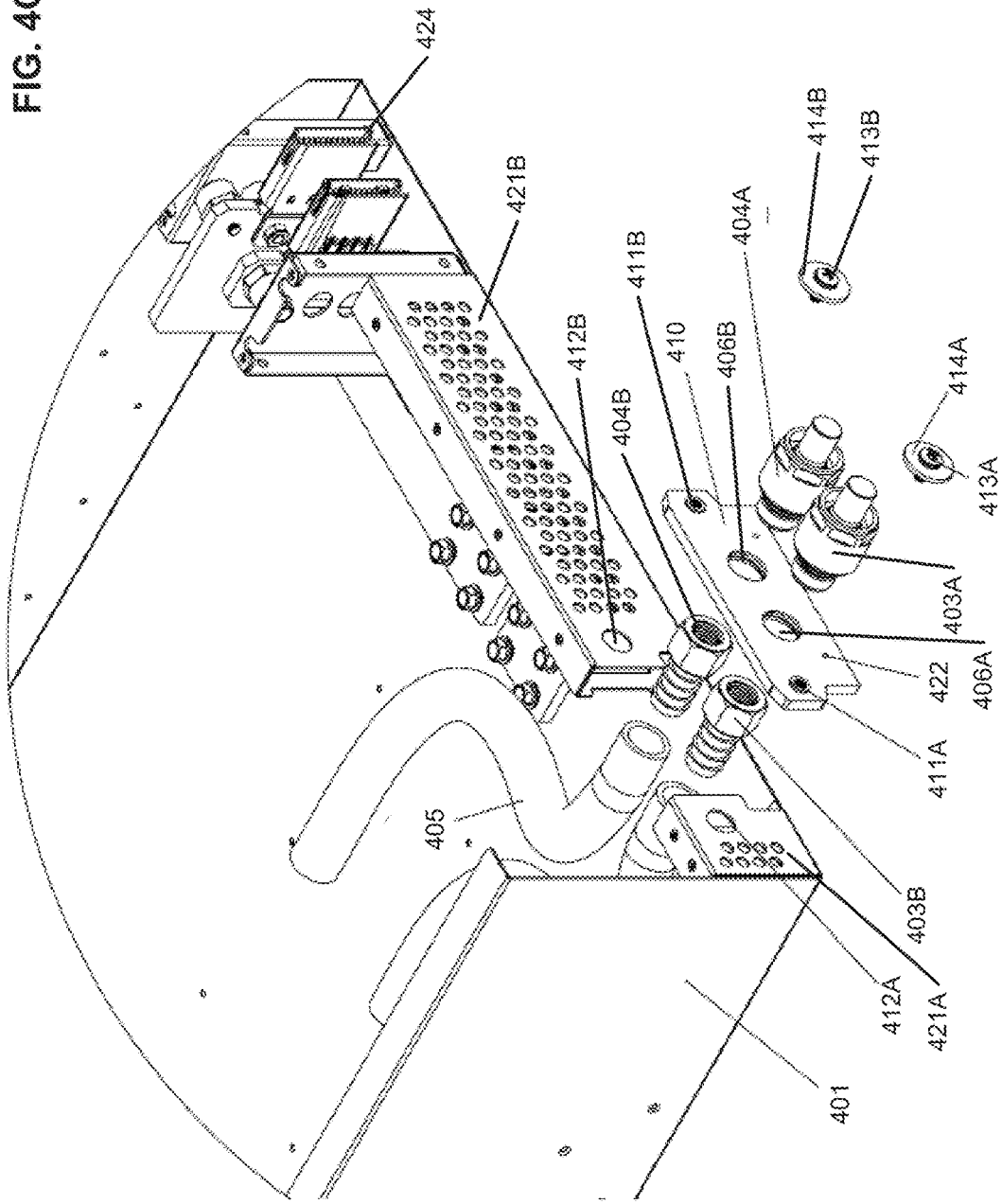

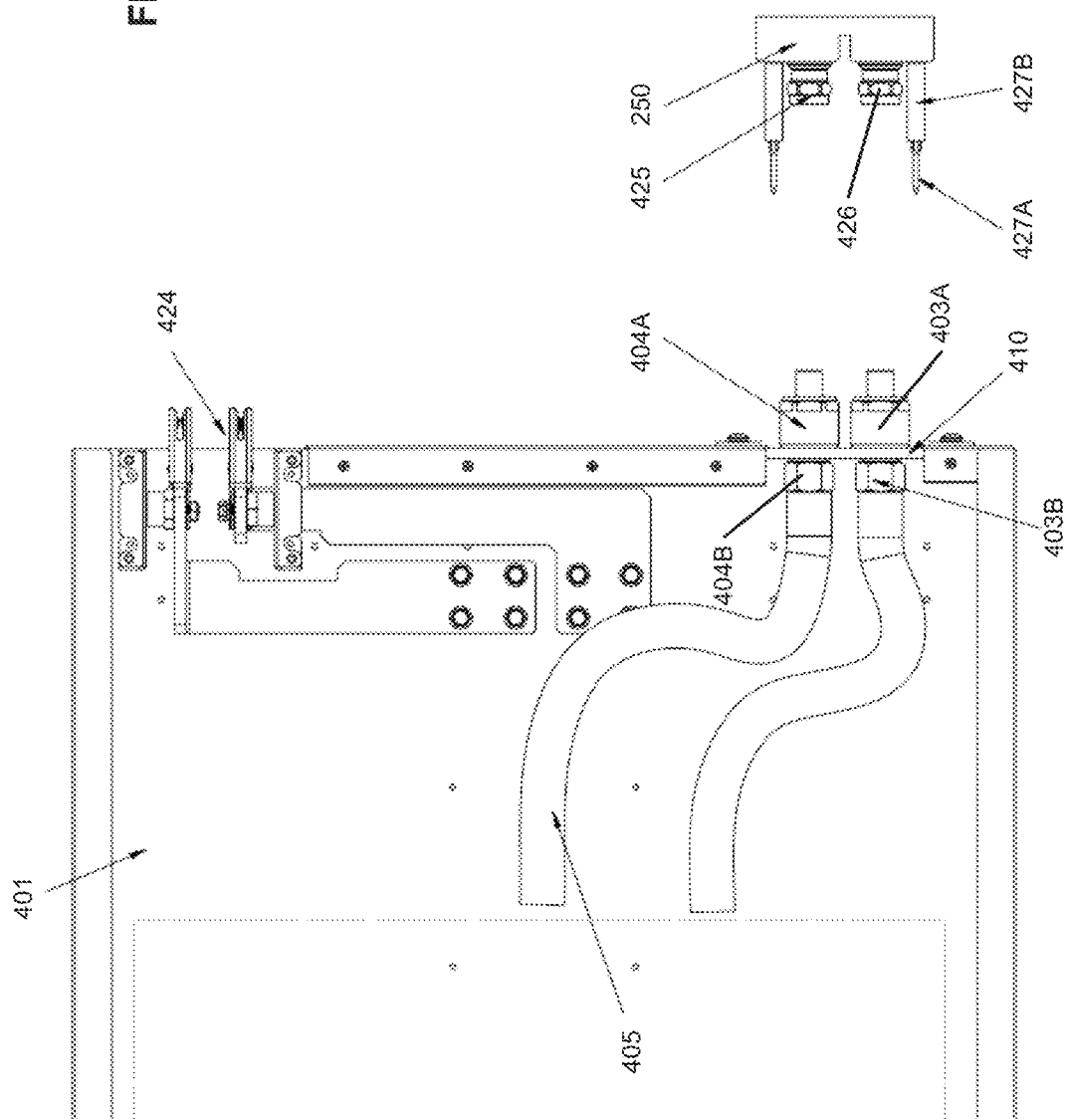

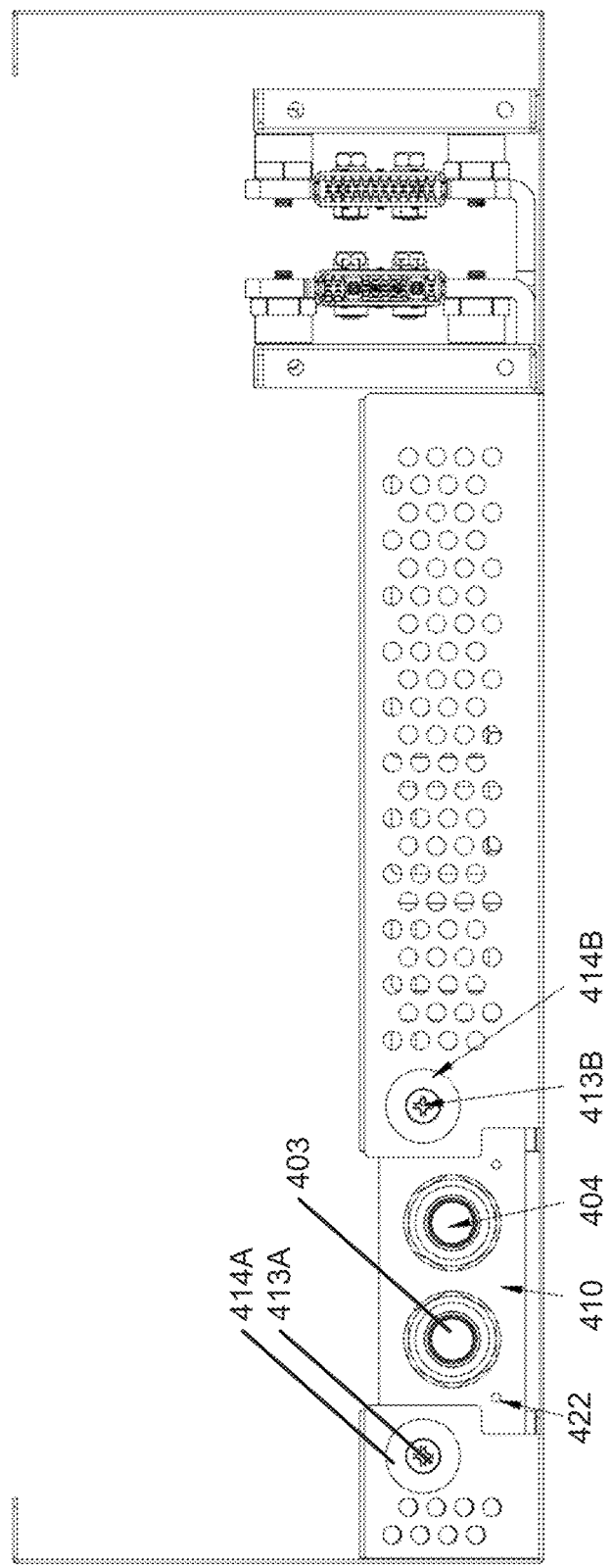

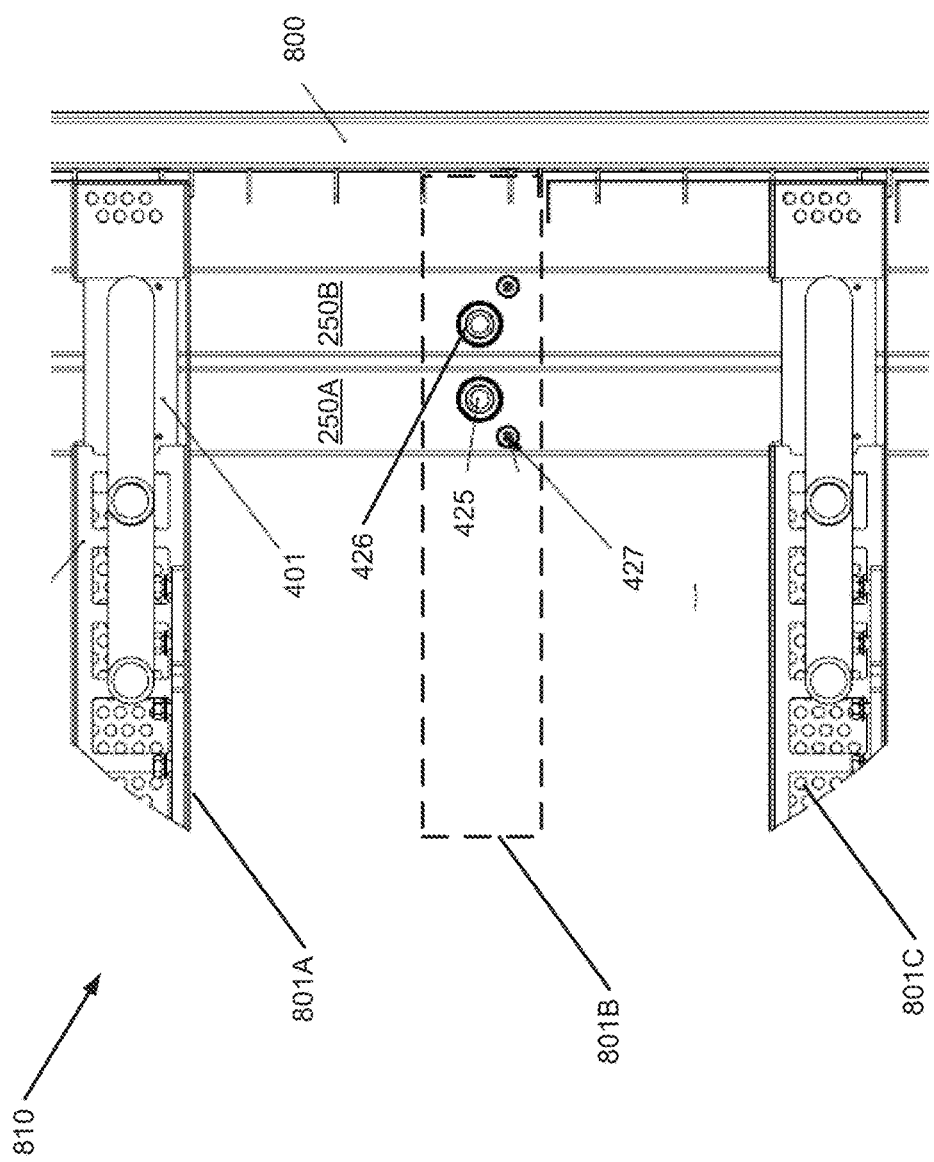

MODULAR SELF-ALIGNING LIQUID HEAT REMOVAL COUPLING SYSTEM FOR ELECTRONIC RACKS

FIELD OF THE INVENTION

Embodiments of the present invention relate generally to data centers. More particularly, embodiments of the invention relate to a modular self-aligning liquid heat removal coupling system for removing heat from electronic racks of IT components in a data center.

BACKGROUND

Heat removal is a prominent factor in computer system and data center design. The number of information technology (IT) components such as servers deployed within a data center has steadily increased as the server performance has improved, thereby increasing the amount of heat generated during the ordinary operation of the servers. The reliability of servers used within a data center decreases if the environment in which they operate is permitted to increase in temperature over time. A significant portion of the data center's power is used for thermal management of electronics at the server level.

Recent trends in computing show a trend toward higher power density. As the number of servers within a data center increases, a greater portion of the power is commensurately consumed by the data center to remove heat from electronic components within the servers. Liquid heat removal offers a solution for higher power computing racks due to the relatively higher hear capacity and greater energy efficiency possible with liquid heat removal. Liquid heat removal solutions are generally more difficult to assemble, test, and operate due to the increased complexity and cost. The operations are often particularly challenging due to the necessity to bring liquid into field replaceable modules. An operator typically has to manually connect, disconnect, and organize the arrays of fittings and tubing.

The complexity of liquid fitting operations has driven manufacturers to create various types of blind mate connectors. These connectors have the ability to engage and disengage simultaneously with the module insertion and removal. Typically, such connectors usually include a self-sealing feature. The self-sealing feature prevents liquid from leaking out of the connector set once it is decoupled. This prevents liquid from leaking out of the liquid thermal management system. A liquid leak could negatively impact computing facility operation. It could also negatively impact liquid thermal management operation if there is no sufficient liquid to operate the system. The requirement of blind mate connectors, however, dictates complex fitting designs in order to accommodate the tolerance typical of electronic racks constructed largely of folded sheet metal. The design constraint of existing technology assumes fixed location of both a host and client fitting outer body and therefore all tolerance gathering ability is therefore designed within the connector body.

BRIEF DESCRIPTION OF THE DRAWINGS

Embodiments of the invention are illustrated by way of example and not limitation in the figures of the accompanying drawings in which like references indicate similar elements.

FIGS. 4A-4C shows a perspective view of a server blade according to one embodiment of the invention.

FIG. 5 is a top view of a server blade according to one embodiment of the invention.

FIG. 6 shows a rear view of a server blade according to one embodiment.

FIGS. 8A-8B shows an internal view of a back panel of an electronic rack according to one embodiment of the invention.

DETAILED DESCRIPTION

Figure 1:
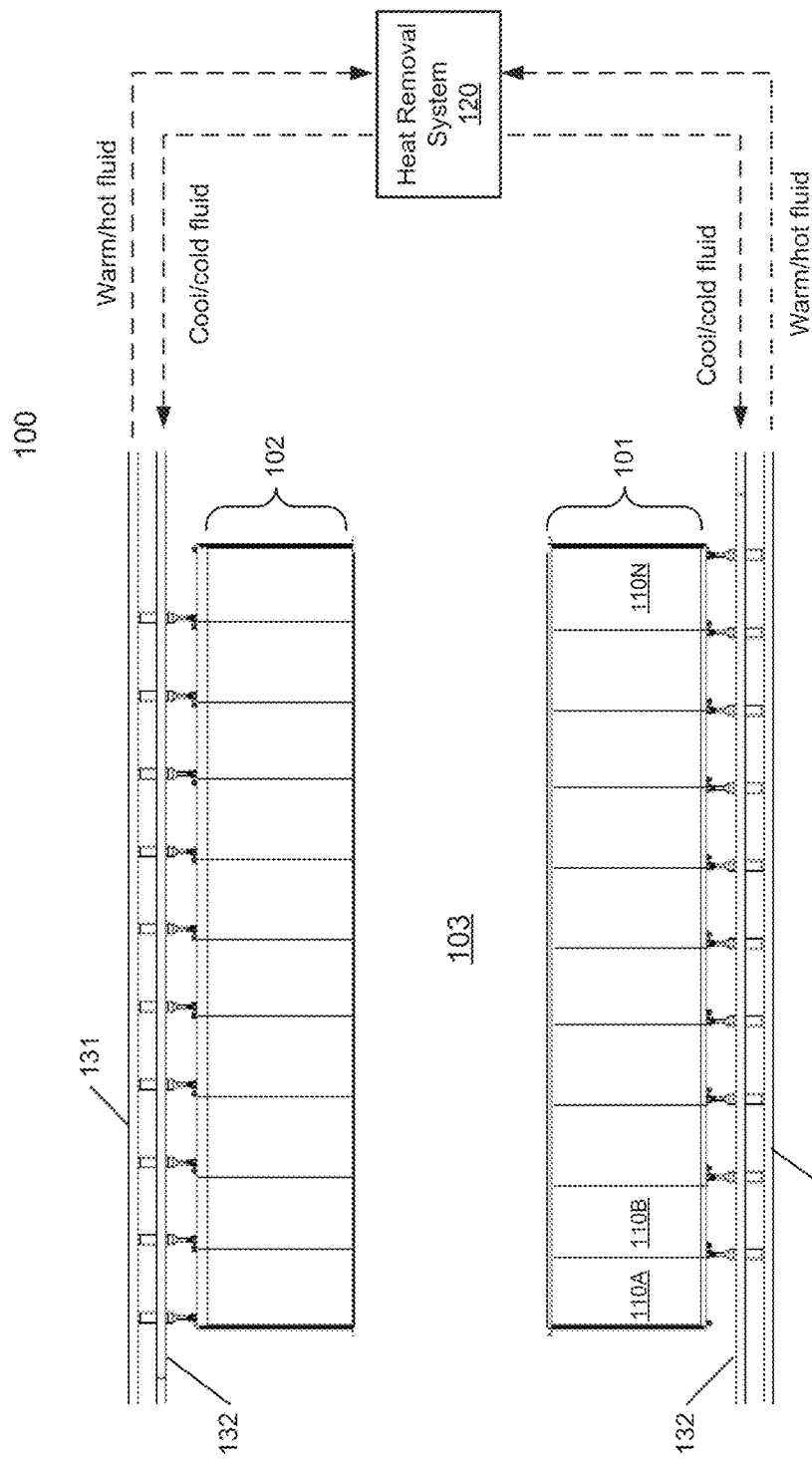
FIG. 1 is a block diagram illustrating a data center system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a blind mate fitting system is provided for modular electronic computing systems that is capable of utilizing liquid fittings that are capable of coupling and decoupling with axial movement (axial coupling). Such a fitting system will have the benefit of reducing complexity of axial couplings with the benefits of reduced operating complexity that blind mate connectors afford. The system includes a mechanical guide to gather a floating panel to be within a required tolerance for the axial couplings and the plumbing attachments to the client fitting must have sufficient compliance for the floating panel to move.

According to one aspect of the invention, an electronic rack includes a back panel, a number of server slots, and a number of server blades capable of being inserted into and removed from the server slots. Each server blade includes a processor, a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system to remove the heat from the server blades. Each server blade can be inserted and removed from a corresponding server slot from a frontend of the electronic rack.

In one embodiment, each server blade includes a server tray to contain an information technology (IT) component representing the corresponding server and a self-fitting coupling assembly having a first liquid intake connector and a first liquid outlet connector to self-align with a second liquid intake connector and a second liquid outlet connector mounted on the liquid manifold assembly mounted on the back panel. The first liquid intake connector is to receive heat removal liquid from the heat removal liquid manifold via the second liquid intake connector. The first liquid outlet liquid connector is to emit warmer or hotter liquid carrying the heat exchanged from the IT component to the heat removal liquid manifold via the second liquid outlet connector and then back to the external heat removal system. In one embodiment, the first liquid intake connector and the first liquid outlet connector are capable of moving around within a predetermined tolerance space with respect to the server tray. As a result, they can self-align with the second liquid intake connector and the second liquid outlet connector fixedly mounted on the heat removal liquid manifold of the back panel, when the server blade is inserted into the corresponding server slot. According to another aspect of the invention, a data center includes a number of electronic racks as described above. Each of the electronic racks includes a number of server blades as described above.

FIG. 1 is a block diagram illustrating a data center system according to one embodiment of the invention. In this example, FIG. 1 shows a top view of at least a portion of a data center. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks arranged in row 101 and row 102 such as electronic racks 110A-110N. However, more or fewer rows of electronic racks may be implemented. Typically, rows 101-102 are aligned in parallel with frontends facing each other and backends facing away from each other, forming aisle 103 in between to allow an administrative person walking therein. However, other configurations or arrangements may also be applied.

In one embodiment, each of the electronic racks (e.g., electronic racks 110A-110N) includes a back panel, a number of server slots, and a number of server blades capable of being inserted into and removed from the server slots. Each server blade includes a processor, a memory, and/or a persistent storage device (e.g., hard disk), which represents a computer server. The back panel is disposed on a backend of the electronic rack. The back panel includes a heat removal liquid manifold assembly to provide heat removal liquid from an external heat removal system 120 to remove heat from the server blades. Each server blade includes can be inserted and removed from a corresponding server slot from a frontend of the electronic rack. Heat removal system 120 may be a chiller system with an active refrigeration cycle. Alternatively, heat removal system 120 can include but are not limited to evaporative cooling, free air, rejection to large thermal mass, and waste heat recovery designs.

In one embodiment, each server blade includes a server tray to contain an information technology (IT) component representing the corresponding server and a self-fitting coupling assembly having a first liquid intake connector and a first liquid outlet connector to self-align with a second liquid intake connector and a second liquid outlet connector mounted on the liquid manifold assembly mounted on the back panel. The first liquid intake connector is to receive heat removal liquid from the heat removal liquid manifold via the second liquid intake connector. The first liquid outlet liquid connector is to emit warmer or hotter liquid carrying the heat exchanged from the IT component to the heat removal liquid manifold via the second liquid outlet connector and then back to the external chiller system. In one embodiment, the first liquid intake connector and the first liquid outlet connector are capable of moving around within a predetermined tolerance space with respect to the server tray. As a result, they can self-align with the second liquid intake connector and the second liquid outlet connector fixedly mounted on the heat removal liquid manifold of the back panel.

The heat removal liquid manifold disposed on the backend of each electronic rack is coupled to liquid supply line 132 to receive heat removal liquid from heat removal system 120. The heat removal liquid is to remove heat from the IT component. The resulting warmer or hotter liquid carrying the heat exchanged from the IT component is transmitted via supply line 131 back to heat removal system 120. Liquid supply lines 131-132 are referred to as data center liquid supply lines (e.g., global liquid supply lines), which supply heat removal liquid to all of the electronic racks of rows 101-102.

Figure 2:
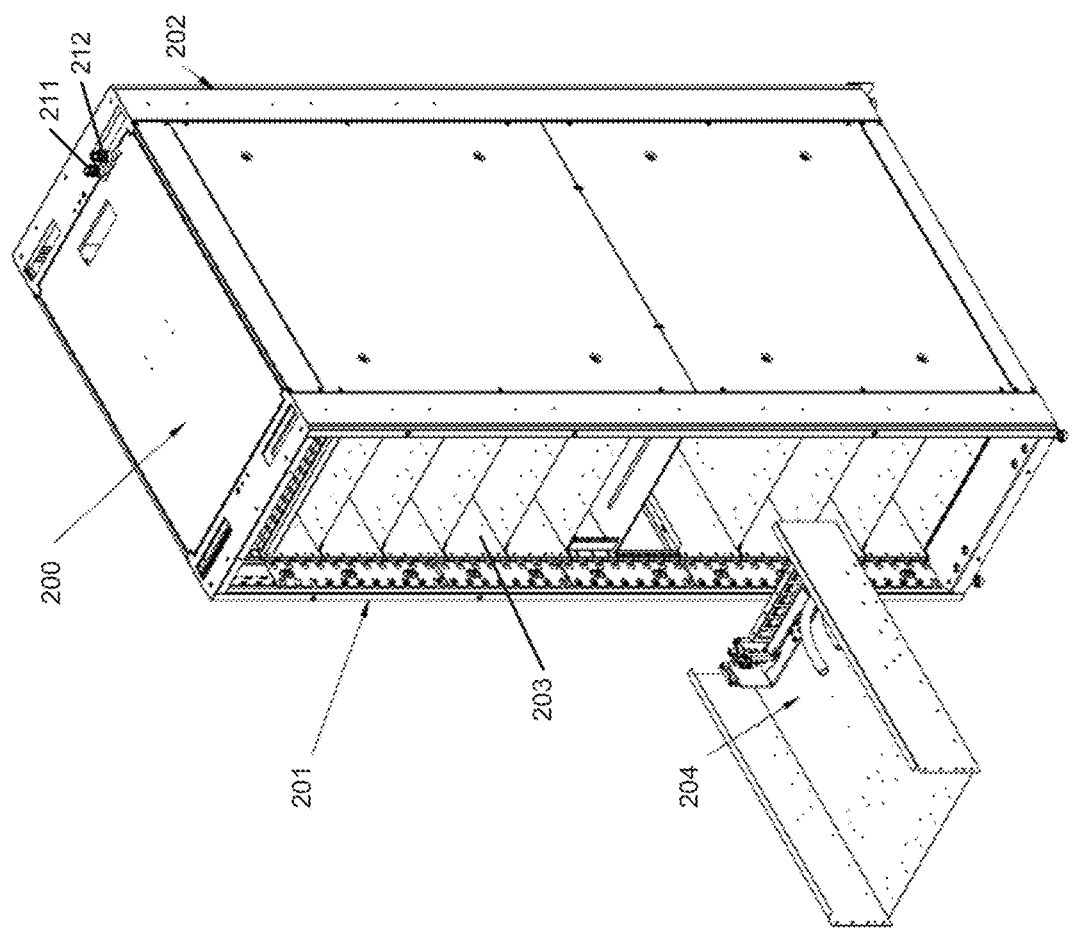
FIG. 2 is a block diagram illustrating an example of an electronic rack according to one embodiment of the invention.

FIG. 2 shows a front perspective view of an electronic rack according to one embodiment of the invention. Electronic rack 200 can represent any of the electronic racks such as electronic racks 110A-110N as shown in FIG. 1. Referring to FIG. 2, electronic rack 200 includes a housing to house a number of sever slots such as server slot 203 to receive a server blade such as server blade 204. Electronic rack 200 includes frontend 201 and backend 202. Backend 202 includes a back panel having a heat removal liquid manifold assembly therein (not shown). The heat removal liquid manifold includes main liquid intake connector 211 and a main liquid outlet connector 212, which can be coupled to liquid supply lines such as liquid supply lines 131-132 to receive heat removal liquid from an external heat removal system such as heat removal system 120 of FIG. 1. For example, main liquid intake connector 211 may be coupled to supply line 132 to receive heat removal liquid and main liquid outlet connector 212 may be coupled to supply line 131 to transmit the warm or hot liquid carrying the heat exchanged from the server blades back to the heat removal system.

According to one embodiment, for each of the server slots such as server slot 203, there is a pair of a liquid intake connector and a liquid outlet connector disposed on the heat removal liquid manifold (not shown). Each of the server blade includes a pair of liquid intake connector and liquid outlet connector disposed on the backend of the server blade. The pair of liquid connectors are capable of moving or floating around with respect to the server blade. When the sever blade is inserted into a server slot, the first pair of liquid connectors of the server blade can engage and align with the second pair of liquid connectors mounted on the heat removal liquid manifold on the back panel. Due to the design feature that the first pair of liquid connectors of the sever blade can move or float around within a predetermined tolerance space, the first pair of liquid connectors can self-align with the second pair of liquid connectors mounted on the heat removal liquid manifold, when the server blade is inserted into the corresponding server slot. The first pair liquid connectors and the second pair liquid connectors are blind mate counterpart connectors. As a result, they can be easily coupled and decoupled with self-alignment.

Figure 3A:
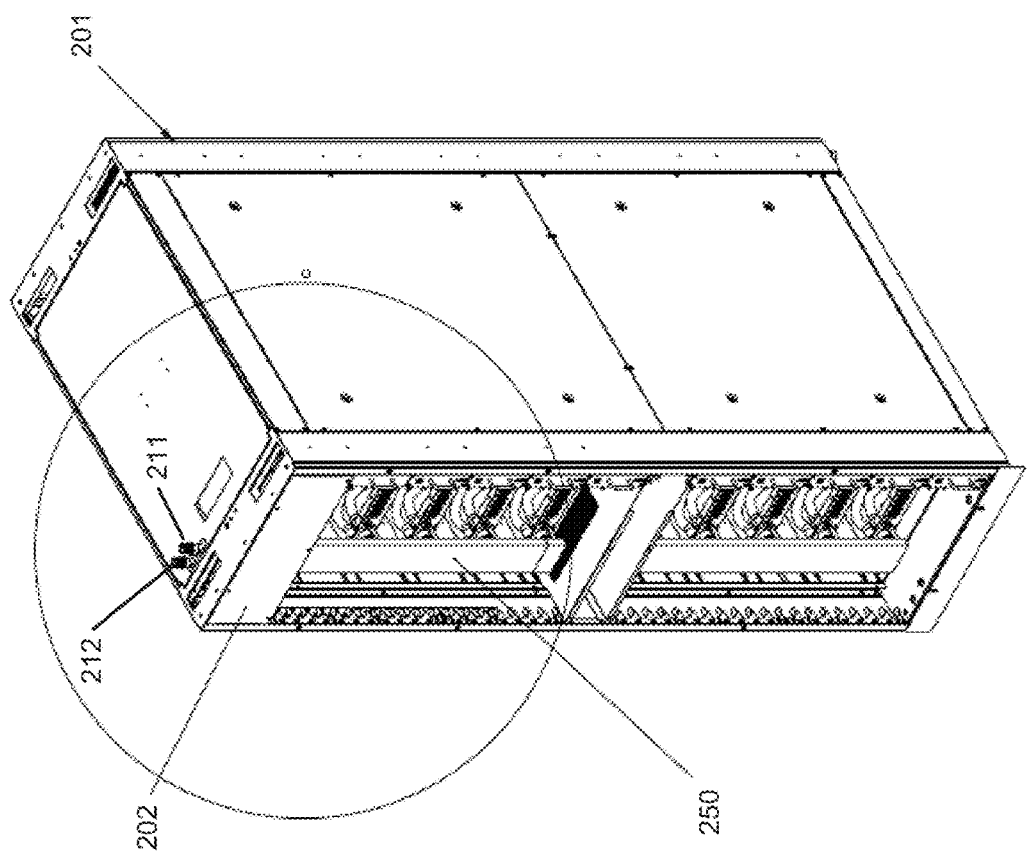
FIGS. 3A-3B shows a back perspective view of an electronic rack according to one embodiment of the invention.
Figure 3B:
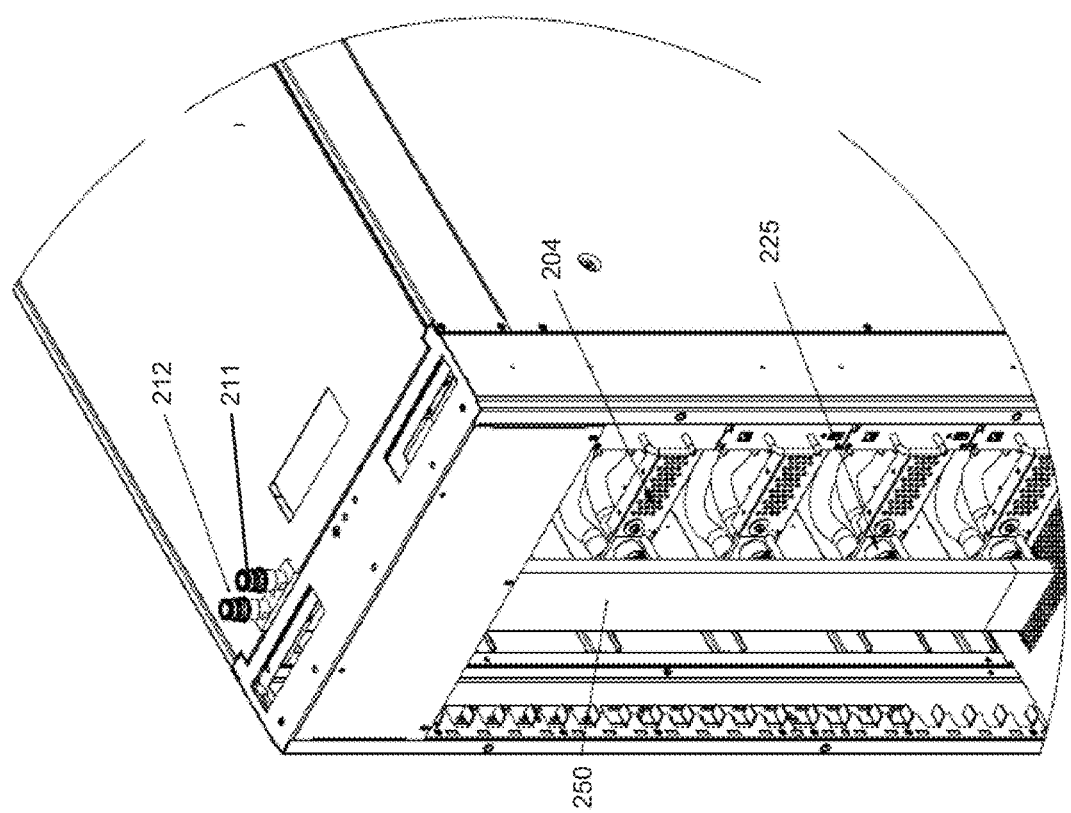

FIGS. 3A-3B show a back perspective view of an electronic rack according to one embodiment of the invention. FIG. 3B shows an enlarge view of a portion of the electronic rack as shown in FIG. 3A. Referring to FIGS. 3A-3B, backend/back panel 202 includes heat removal liquid manifold assembly 250, which may include a pair of liquid supply lines coupled to main liquid connectors 211-212. Liquid manifold assembly 250 includes a number of pairs of liquid connectors. Each of the pairs corresponds to one of the server slots to engage and couple to the counterpart liquid connectors (e.g., blind mate connectors 225) of the server blade with self-alignment.

Figure 4A:
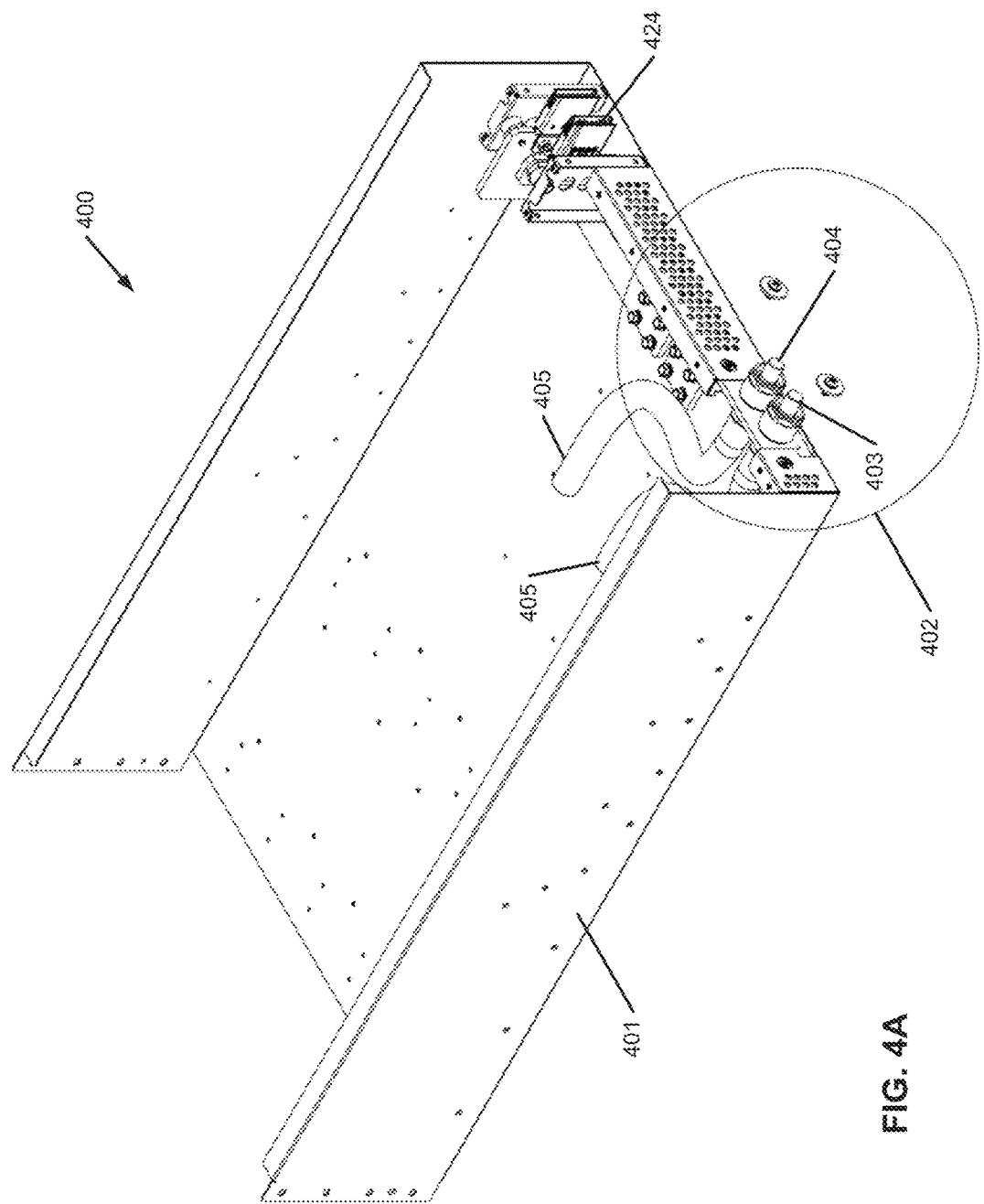
Figure 4B:
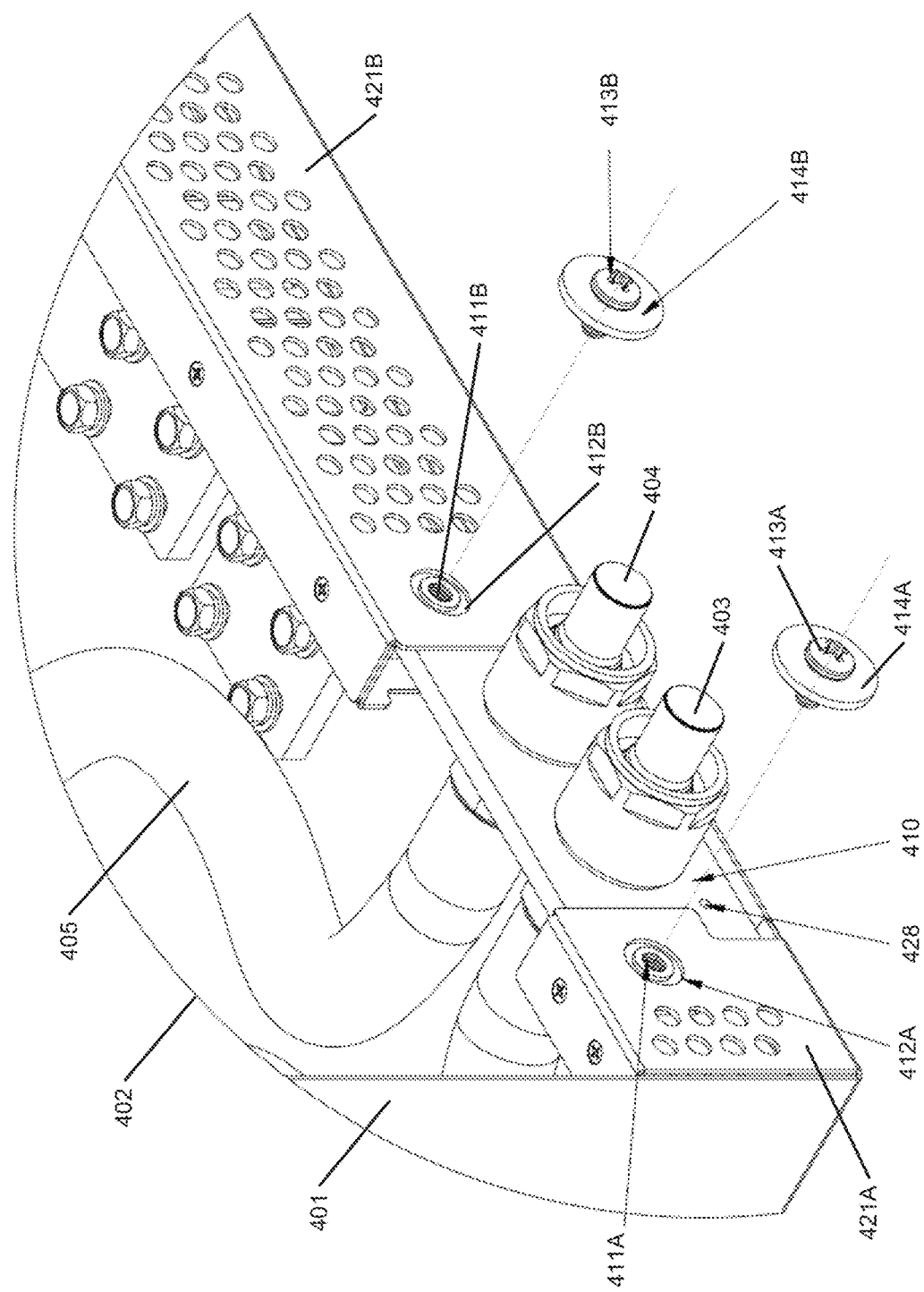

FIGS. 4A-4C show a perspective view of a server blade according to one embodiment of the invention. FIG. 4B shows an enlarged view of a portion of the server blade as shown in FIG. 4A. FIG. 4C is an exploded view of the enlarged view of FIG. 4B. Referring to FIGS. 4A-4B, server blade 400 includes server tray or server holder 401 to contain an IT component therein (not shown), which can be a processor, a memory, and/or a persistent storage device, or any other components that may be reasonably included as a part of a computer server. Server blade 400 further includes a self-fitting assembly 402 having a pair liquid connectors 403-404 to be coupled to a counterpart pair of liquid connectors mounted on the heat removal liquid manifold assembly as described above.

Liquid connectors 403-404 are coupled to a first end and a second end of a liquid distribution tube or pipe 405, forming a closed loop. Liquid distribution tube 405 is to distribute the heat removal liquid to the IT component at various locations within the server blade, where the heat removal liquid exchanges the heat generated from the IT component. For the purpose of illustration, liquid connector 403 is a liquid intake connector to receive heat removal liquid from the heat removal liquid manifold 250. The heat removal liquid is then carried through the liquid distribution tube 405 to remove heat from the IT component. Liquid connector 404 is a liquid outlet connector to emit the warmer or hotter liquid carrying the exchanged heat back to the heat removal liquid manifold 250.

According to one embodiment, referring now to FIG. 4B, self-fitting mechanism 402 includes an alignment plate 410 having first liquid connector 403 and second liquid connector 404 mounted thereon. For example, liquid connector 403 may be a liquid intake connector and liquid connector 404 may be a liquid outlet connector. The liquid connectors 403-404 are fixedly mounted on alignment plate 410. However, alignment plate 410 together with liquid connectors 403-404 is not fixedly mounted on server tray 401. Rather, according to one embodiment, alignment plate 410 together with liquid connectors 403-404 can move around or float around with respect the rest of server tray 401. Alignment plate 410 together with liquid connectors 403-404 can move around within a predetermined tolerance space relative to server tray 401. As a result, when the corresponding server blade having server tray 401 is inserted into a server slot, liquid connectors 403-404 can move around to self-align or self-fit with the counterpart liquid connectors disposed on heat removal liquid manifold on the back panel.

In one embodiment, as shown in FIG. 4C, alignment plate 410 includes a pair of mounting holes to mount liquid connectors 403-404. Each of the liquid connectors includes a screw segment (e.g., segment 403A) and a nut segment (e.g., segment 403B). The screw segment can be screwed onto the nut segment through a mounting hole (e.g., mounting hole 406) to be fixedly mounted onto alignment plate 410 by sandwiching alignment plate 410. Thus, liquid connectors 403-404 are mounted on the fixed positions with respect to alignment plate 410. The alignment plate 410 is also referred to as a floating alignment plate because it can float around without being fixed onto a fixed location.

Referring to FIGS. 4B and 4C, alignment plate 410 can be positioned aligned with alignment brackets 421A-421B fixed attached to server tray. There is an opening between alignment brackets 421A-421B to expose liquid connectors 403-404 on the backend of server tray 401. Note that alignment brackets 421A-421B can be a single piece of alignment bracket having an opening or window to expose liquid connectors 403-404. In one embodiment, alignment brackets 421A-421B includes two L-shape plates to form a pipe or tube (e.g., rectangular pipe or tube in this example) to loosely contain alignment plate 410 therein, such that alignment plate 410 can move around within the internal space or tunnel of rectangular pipe or tube.

In one embodiment, alignment plate 410 includes stoppers 411A-411B attached thereon and extended outwardly. Each of the alignment brackets 421A-421B includes an alignment guide such as alignment guides 412A-412B. In this example, alignment guides 412A-412B are formed in a circular shape to allow stoppers 411A-411B to be exposed therethrough. In one embodiment, stoppers 411A-411B are screw nuts molded or attached onto alignment plate 410. Screw nuts 411A-411B include internal screw threads to allow a screw to be screwed into therein. A pair of screws 413A-413B together with a pair of washers 414A-414B can be utilized to constrain alignment plate 410 to a limited vertical space (e.g., a back-and-forth tolerance space) without fixedly attaching onto alignment brackets 421A-421B.

The size of washers 414A-414B are larger than the size of alignment guides 412A-412B so that alignment plate 410 does not fall off or drift too much away from the surface of alignment brackets 421A-421B. In one embodiment, the length or height of the screw nuts 411A-411B is longer or thicker than the thickness of alignment plate 410, such that when a screw such as screws 413A-413B screws onto it, it allows a certain space between the surfaces of alignment plate 410 and alignment brackets 421A-421B to move around. Note that in this example, there are two stoppers 411A-411B disposed near liquid connectors 403-404 respectively. In another embodiment, one pair of a stopper and an alignment guide may be sufficient for self-alignment purpose.

According to one embodiment, the movement of alignment plate 410 together with liquid connectors 403-404 can be restricted by alignment guides 412A-412B by limiting the movement of stoppers 411A-411B within the space of defined by alignment guides 412A-412B, while alignment brackets 421A-421B remain in a fixed position. The size (e.g., diameter) of alignment guides 412A-412B are larger than the size of stoppers 411A-411B. The physical space between the edges of alignment guides 412A-412B and stoppers 411A-411B defines the tolerance space. The combination of alignment plate 410 and liquid connectors 403-404 can move or float within the tolerance space for the purpose of self-aligning with the counterpart liquid connectors disposed on heat removal liquid manifold 250. The size of the tolerance space may vary dependent upon the specific implementation. Note that in this example, the shapes of alignment guides 412A-412B are formed in a circular shape. However, the shapes of alignment guides 412A-412B can be formed in other shapes such as an oval shape, a rectangular shape, etc.

FIG. 5 is a top view of a server blade according to one embodiment of the invention. Referring to FIG. 5, liquid connectors 403-404 together with floating alignment plate 410 can self-align with counterpart liquid connectors 415-416 mounted on heat removal liquid manifold 250. For better alignment, an alignment pin such as alignment pin 427 having pin segments 427A and 427B disposed fixedly with respect to liquid connectors 425-426 is utilized to align with alignment hole disposed on alignment plate 410, such as alignment hole 428 of FIG. 4B. That is, the self-fitting or self-alignment mechanism described above can be used to coarsely align liquid connectors 403-404 with counterpart liquid connectors 425-426, while alignment pin 427 is utilized to precisely or finely align liquid connectors 403-404 with liquid connectors 425-426.

In one embodiment, pin segment 427A is utilized for alignment purpose while pin segment 727B, which has a larger diameter than pin segment 427A and the alignment hole 428 can be used to maintain a distance between liquid connectors 403-404 and 425-426 to prevent the liquid connectors from being pushed too much against each other. FIG. 6 shows a rear view of a server blade according to one embodiment. On the backend of server blade 401, a power supply connector 424 is also mounted to connect with a main power supply line of a data center.

Figure 7A:
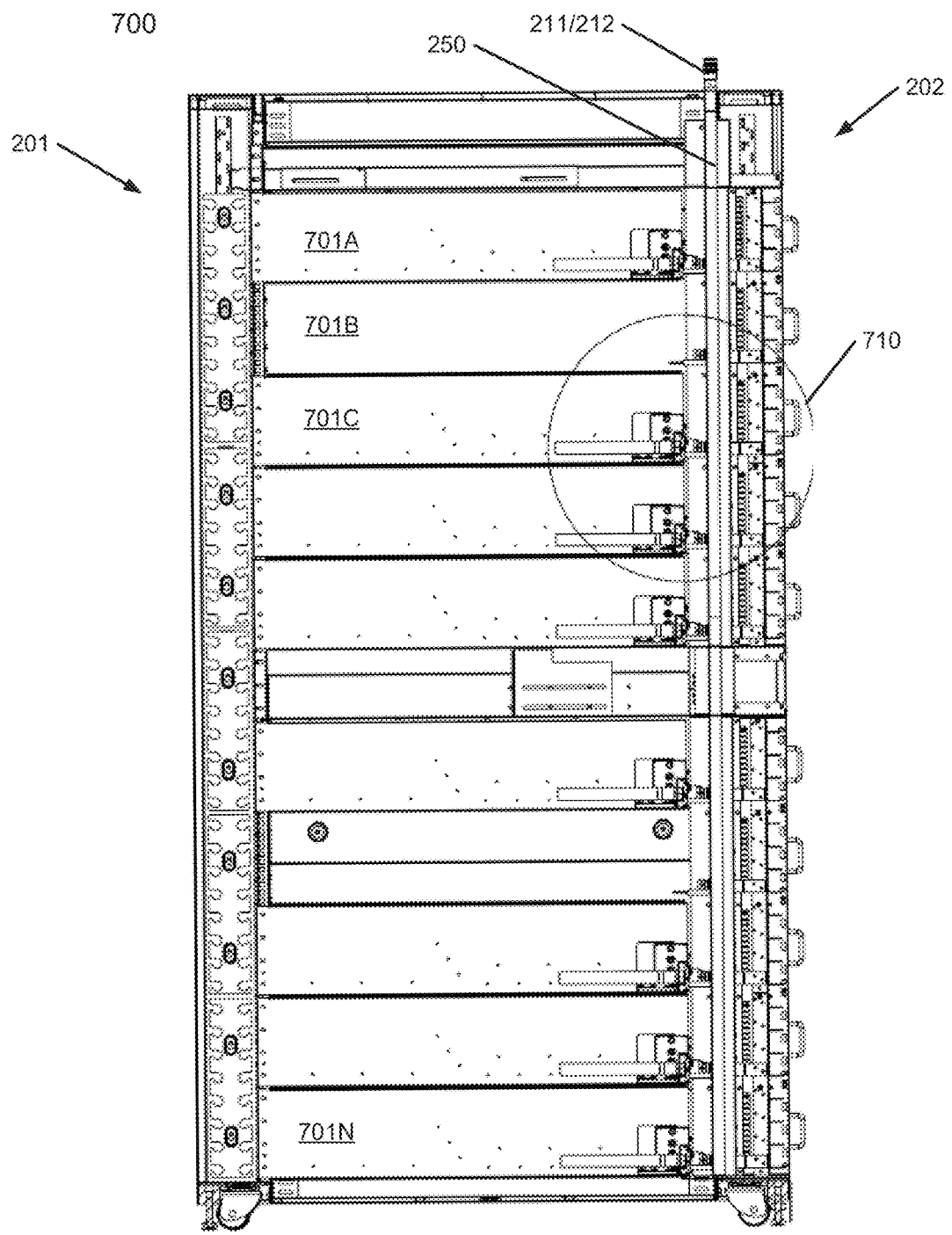
FIGS. 7A-7B shows a cross-section view of an electronic rack according to one embodiment.
Figure 7B:
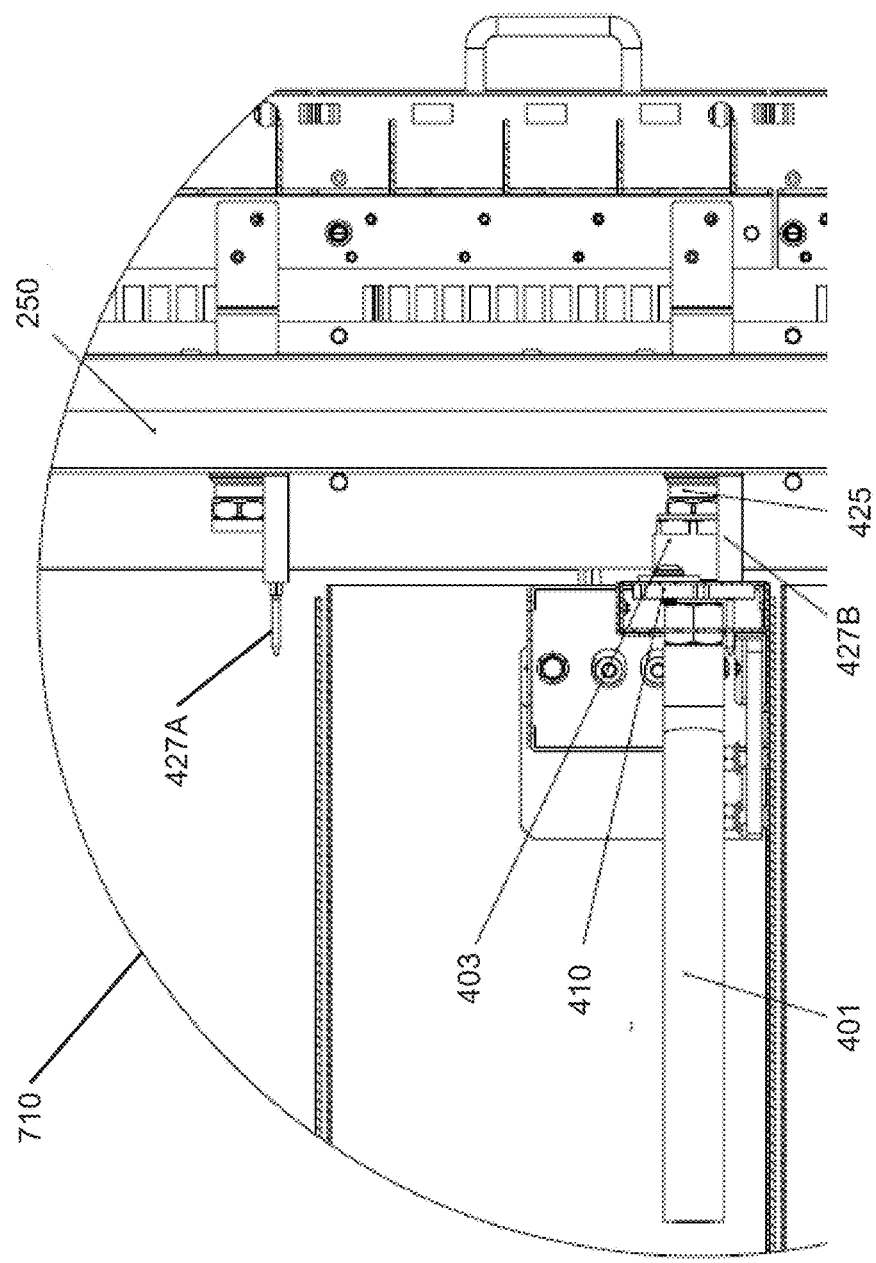

FIGS. 7A-7B show a cross-section view of an electronic rack according to one embodiment. Electronic rack 700 may represent electronic rack 200 of FIG. 2. Referring to FIG. 7A, electronic rack 700 includes a number of sever slots 701A-701N to allow a number of server blades to be inserted from frontend 201. On backend 202, heat removal liquid manifold 250 is mounted on back panel 202 on the backend of electronic rack 700. The self-fitting mechanism disposed on the backend of a server blade can be utilized to self-align with liquid connectors fixedly mounted on heat removal liquid manifold 250 as described above. FIG. 7B shows an enlarged portion 710 of electronic rack 700 as shown in FIG. 7A.

Figure 8A:
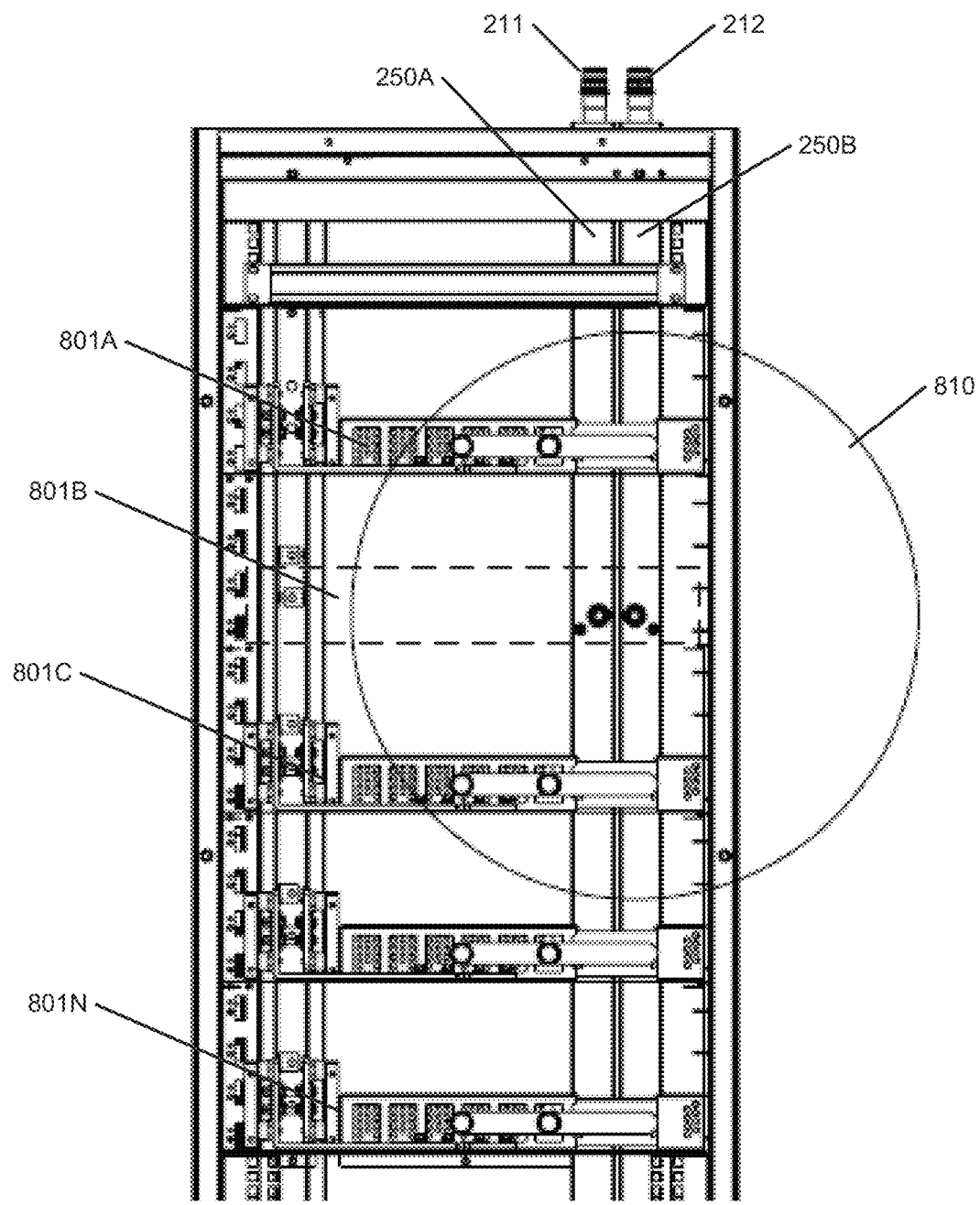

FIGS. 8A-8B show an internal view of a back panel of an electronic rack according to one embodiment of the invention. Electronic rack 800 can represent any of the electronic racks described above. FIG. 8A shows an internal view of a back panel in which a viewer is looking from the frontend of electronic rack 800 by removing any obstacles in between. Referring to FIG. 8A, electronic rack 800 includes a number of server blades 801A-801N that can be inserted into the corresponding server slots. On the back panel there are two liquid manifolds 250A-250B to receive heat removal liquid from an external heat removal system via liquid intake connector 211 and to emit warmer/hotter liquid back to the heat removal system via liquid outlet connector 212. For each of the server slots, there is a pair of liquid connectors (e.g., liquid connectors 425-426) mounted on liquid manifolds 250A-250B to connect with the liquid counterpart connectors disposed on the backend of the corresponding server blade as described above. FIG. 8B shows an enlarged view of a portion of electronic rack 800.

Note that the heat removal techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
 a back panel disposed on a backend of the electronic rack, wherein the back panel includes a heat removal liquid manifold assembly to provide heat removal liquid from an external heat removal system; and
 a plurality of server blades contained in a plurality of server slots via a frontend of the electronic rack, wherein each of the server blades comprises
  a server tray to contain an information technology (IT) component representing a corresponding server therein, and
  a self-fitting coupling assembly having a first liquid intake connector and a first liquid outlet connector, the first liquid intake connector to receive the heat removal liquid from the heat removal liquid manifold assembly to remove heat from the IT component, the first liquid outlet connector to emit warmer liquid carrying heat exchanged from the IT component to the heat removal liquid manifold assembly, wherein the first liquid intake connector and the first liquid outlet connector are capable of moving around relative to the server tray within a predetermined tolerance space to self-align with a second liquid intake connector and a second liquid outlet connector, wherein the first liquid intake connector and the first liquid outlet connector are not fixedly attached to the server tray, and wherein the second liquid intake connector and the second liquid outlet connector are fixedly disposed on the heat removal liquid manifold assembly of the back panel respectively,
 the self-fitting coupling assembly including a floating alignment plate having the first liquid intake connector and the first liquid outlet connector mounted thereon, wherein the floating alignment plate includes a stopper extended outwardly towards the back panel, the stopper including an internal screw thread.

2. The electronic rack of claim 1, wherein the self-fitting coupling assembly comprises:
 an alignment bracket fixedly mounted on an backend of the server tray, wherein the alignment bracket includes an alignment guide to expose the stopper of the floating alignment plate through the alignment guide, which guides the floating alignment plate to move within the predetermined tolerance space while the alignment bracket remains steady.

3. The electronic rack of claim 2, wherein the floating alignment plate together with the first liquid intake connector and the first liquid outlet connector is capable of moving with respect to the alignment bracket within a predetermined space defined by the stopper and the alignment guide to align with the second liquid intake connector and the second liquid outlet connector.

4. The electronic rack of claim 3, wherein the predetermined space is limited by a relative space between the stopper and an edge of the alignment guide.

5. The electronic rack of claim 2, wherein the stopper comprises a screw nut having an internal screwing thread to allow a screw to screw into the screw nut via the internal screwing thread to loosely attach the floating alignment plate onto the alignment bracket while allowing the screw nut to move within the alignment guide of the alignment bracket.

6. The electronic rack of claim 2, wherein the stopper comprises a first stopper disposed near the first liquid intake connector and a second stopper disposed near the first liquid outlet connector, and wherein the alignment guide comprises a first alignment guide to expose the first stopper extended therethrough and a second alignment guide to expose the second stopper extended therethrough.

7. The electronic rack of claim 6, wherein the alignment bracket further comprises an opening to expose the first liquid intake connector and the first liquid outlet connector therethrough, and wherein the first liquid intake connector and the first liquid outlet connector together with the floating alignment plate are capable of moving around within the opening of the alignment bracket.

8. The electronic rack of claim 1, wherein the first liquid intake connector is coupled to a first end of a liquid distribution tube and the first liquid outlet connector is coupled to a second end of the liquid distribution tube, and wherein the liquid distribution tube is to distribute the heat removal liquid and to exchange the heat from the IT component.

9. The electronic rack of claim 1, wherein the first liquid intake connector and the second liquid intake connector form a first pair of blind mated connectors, and wherein the second liquid outlet connector and the second liquid outlet connector form a second pair of blind mated connectors.

10. A data center, comprising:
a heat removal system to provide heat removal liquid; and
a plurality of electronic racks, each of the electronic racks including
a back panel disposed on a backend of the electronic rack, wherein the back panel includes a heat removal liquid manifold assembly to provide the heat removal liquid from the heat removal system; and
a plurality of server blades contained in a plurality of server slots via a frontend of the electronic rack, wherein each of the server blades comprises a server tray to contain an information technology (IT) component representing a corresponding server therein, and
a self-fitting coupling assembly having a first liquid intake connector and a first liquid outlet connector, the first liquid intake connector to receive heat removal liquid from the heat removal liquid manifold assembly to remove heat from the IT component, the first liquid outlet connector to emit warmer liquid carrying heat exchanged from the IT component to the heat removal liquid manifold assembly, wherein the first liquid intake connector and the first liquid outlet connector are capable of moving around within a predetermined tolerance space relative to the server tray to self-align with a second liquid intake connector and a second liquid outlet connector, wherein the first liquid intake connector and the first liquid outlet connector are not fixedly attached to the server tray, and wherein the second liquid intake connector and the second liquid outlet connector are fixedly disposed on the heat removal liquid manifold assembly of the back panel respectively,
the self-fitting coupling assembly including a floating alignment plate having the first liquid intake connector and the first liquid outlet connector mounted thereon, wherein the floating alignment plate includes a stopper extended outwardly towards the back panel, the stopper including an internal screw thread.

11. The data center of claim 10, wherein the self-fitting coupling assembly comprises:
an alignment bracket fixedly mounted on an backend of the server tray, wherein the alignment bracket includes an alignment guide to expose the stopper of the floating alignment plate through the alignment guide, which guides the floating alignment plate to move within the predetermined tolerance space while the alignment bracket remains steady.

12. The data center of claim 11, wherein the floating alignment plate together with the first liquid intake connector and the first liquid outlet connector is capable of moving with respect to the alignment bracket within a predetermined space defined by the stopper and the alignment guide to align with the second liquid intake connector and the second liquid outlet connector.

13. The data center of claim 12, wherein the predetermined space is limited by a relative space between the stopper and an edge of the alignment guide.

14. The data center of claim 11, wherein the stopper comprises a screw nut having an internal screwing thread to allow a screw to screw into the screw nut via the internal screwing thread to loosely attach the floating alignment plate onto the alignment bracket while allowing the screw nut to move within the alignment guide of the alignment bracket.

15. The data center of claim 11, wherein the stopper comprises a first stopper disposed near the first liquid intake connector and a second stopper disposed near the first liquid outlet connector, and wherein the alignment guide comprises a first alignment guide to expose the first stopper extended therethrough and a second alignment guide to expose the second stopper extended therethrough.

16. The data center of claim 15, wherein the alignment bracket further comprises an opening to expose the first liquid intake connector and the first liquid outlet connector therethrough, and wherein the first liquid intake connector and the first liquid outlet connector together with the floating alignment plate are capable of moving around within the opening of the alignment bracket.

17. A server blade for an electronic rack, comprising:
a server tray to contain an information technology (IT) component representing a server therein; and
a self-fitting coupling assembly having a first liquid intake connector and a first liquid outlet connector, wherein the first liquid intake connector is to receive heat removal liquid from a heat removal liquid manifold assembly of a back panel disposed on a backend of the electronic rack to remove heat from the IT component, wherein the first liquid outlet connector is to emit warmer liquid carrying heat exchanged from the IT component to the heat removal liquid manifold assembly,
wherein the first liquid intake connector and the first liquid outlet connector are capable of moving around within a predetermined tolerance space relative to the server tray to self-align with a second liquid intake connector and a second liquid outlet connector, wherein the first liquid intake connector and the first liquid outlet connector are not fixedly attached to the server tray, and wherein the second liquid intake connector and the second liquid outlet connector are fixedly disposed on the heat removal liquid manifold assembly of the back panel respectively, and wherein the heat removal liquid manifold assembly is to receive the heat removal liquid received from an external heat removal system,
the self-fitting coupling assembly including a floating alignment plate having the first liquid intake connector and the first liquid outlet connector mounted thereon, wherein the floating alignment plate includes a stopper extended outwardly towards the back panel, the stopper including an internal screw thread.

18. The server blade of claim 17, wherein the self-fitting coupling assembly comprises:
an alignment bracket fixedly mounted on an backend of the server tray, wherein the alignment bracket includes an alignment guide to expose the stopper of the floating alignment plate through the alignment guide, which guides the floating alignment plate to move within the predetermined tolerance space while the alignment bracket remains steady.

19. The server blade of claim 18, wherein the floating alignment plate together with the first liquid intake connector and the first liquid outlet connector is capable of moving with respect to the alignment bracket within a predetermined space defined by the stopper and the alignment guide to align with the second liquid intake connector and the second liquid outlet connector.

20. The server blade of claim 19, wherein the predetermined space is limited by a relative space between the stopper and an edge of the alignment guide.

21. The server blade of claim 18, wherein the stopper comprises a screw nut having an internal screwing thread to allow a screw to screw into the screw nut via the internal screwing thread to loosely attach the floating alignment plate onto the alignment bracket while allowing the screw nut to move within the alignment guide of the alignment bracket.

22. The server blade of claim 18, wherein the stopper comprises a first stopper disposed near the first liquid intake connector and a second stopper disposed near the first liquid outlet connector, and wherein the alignment guide comprises a first alignment guide to expose the first stopper extended therethrough and a second alignment guide to expose the second stopper extended therethrough.

23. The server blade of claim 22, wherein the alignment bracket further comprises an opening to expose the first liquid intake connector and the first liquid outlet connector therethrough, and wherein the first liquid intake connector and the first liquid outlet connector together with the floating alignment plate are capable of moving around within the opening of the alignment bracket.

* * * * *